United States Patent
Chia et al.

(10) Patent No.: US 7,582,961 B2
(45) Date of Patent: Sep. 1, 2009

(54) PACKAGE STRUCTURE WITH CIRCUITS DIRECTLY CONNECTED TO SEMICONDUCTOR CHIP

(75) Inventors: Kan-Jung Chia, Hsinchu (TW); Shih-Ping Hsu, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 90 days.

(21) Appl. No.: 12/020,693

(22) Filed: Jan. 28, 2008

(65) Prior Publication Data

US 2008/0179725 A1 Jul. 31, 2008

(30) Foreign Application Priority Data

Jan. 30, 2007 (TW) .............................. 96103287 A

(51) Int. Cl.
*H01L 23/12* (2006.01)
*H01L 23/053* (2006.01)

(52) U.S. Cl. ...................................... 257/698; 257/700
(58) Field of Classification Search ................. 257/698, 257/700, 687, 701, 782, 783
See application file for complete search history.

(56) References Cited

U.S. PATENT DOCUMENTS

| 3,381,182 | A * | 4/1968 | Thornton ..................... 257/508 |
| 3,440,498 | A * | 4/1969 | Mitchell ...................... 257/524 |
| 5,973,928 | A * | 10/1999 | Blasi et al. .................. 361/760 |
| 7,535,086 | B2* | 5/2009 | Merilo et al. ................ 257/676 |
| 2007/0285907 | A1* | 12/2007 | Nishikawa et al. .......... 361/763 |
| 2008/0274579 | A1* | 11/2008 | Yang et al. ..................... 438/64 |

* cited by examiner

*Primary Examiner*—S. V Clark
(74) *Attorney, Agent, or Firm*—Lowe Hauptman Ham & Berner, LLP

(57) ABSTRACT

A package structure with circuit directly connected to semiconductor chip, which comprises: a carrier board, a semiconductor chip, and at least a built-up structure. The carrier board is formed with a through cavity therein. The semiconductor chip is mounted in the through cavity of the carrier board, and a lateral surface of the semiconductor chip is coated by an adhesive material which is not contacted by the carrier board. The built-up structure, which includes a dielectric layer, is disposed on the surface of the carrier board and an active surface of the semiconductor chip. Part surface of the dielectric layer is exposed by the through cavity. The present invention decreases warpage of the packaging structure resulting from asymmetrical built-up structures.

18 Claims, 7 Drawing Sheets

FIG. 1 (Prior arts)

PACKAGE STRUCTURE WITH CIRCUITS DIRECTLY CONNECTED TO SEMICONDUCTOR CHIP

RELATED APPLICATIONS

The present application is based on, and claims priority from, Taiwan Patent Application Number 096103287, filed Jan. 30, 2007, the disclosure of which is hereby incorporated by reference herein in its entirety.

BACKGROUND OF THE INVENTION

1. Field of the Invention

The present invention relates to a packaging structure with circuits directly connected to a semiconductor chip, and, more particularly, to a packaging structure with circuits directly connected to a semiconductor chip that has both characteristics of ceramic rigidity and metal tenacity and can be used to reduce substrate warpage resulting from asymmetrical built-up structures.

2. Description of Related Art

Customer demands of the electronics industry continue to evolve rapidly and the main trends are high integration and miniaturization. In order to satisfy those requirements, especially in the packaging of semiconductor devices, development of circuit boards with the maximum of active and passive components and conductive wires has progressed from single to multiple layer types. This means that a greater usable area is available due to interlayer connection technology.

First, semiconductor chip carrier boards suitable for semiconductor devices, such as substrates or conductive wire frames, are manufactured through a common semiconductor chip carrier manufacturer. Then, the semiconductor chip carrier is processed by semiconductor chip attachment, wire bonding, molding, implanting solder balls etc. for assembling semiconductor devices. Finally, the semiconductor devices having electronic functions required by clients are completed. Because the steps of the practical manufacture are minute and complex, interfaces are not integrated easily at the time when manufactured by different fabricating proprietors. Further, if the client wants to change the function design, efficiency and economic benefit will suffer complexity of integration and modification.

In the conventional semiconductor device, semiconductor chips are 10 mounted on top of a substrate, and then processed in wire bonding, or connecting the semiconductor chip which has the solder bump thereon to the conductive pads on the substrate, followed by placing solder balls on the back of the substrate to provide electrical connections for printed circuit boards. Although an objective of high quantity pin counts is achieved, this condition is limited by way of long pathways of conductive lines making electric characteristics unable to be improved in the more frequent and high-speed operating situations. Otherwise, the complexity of the manufacture is only relatively increased because too many connective interfaces are required for conventional packages.

In many studies, semiconductor chips directly conducting to external electronic devices are embedded into a package substrate to shorten conductive pathways, decrease signal loss and distortion, and accelerate operations.

In a carrier structure embedded with a semiconductor chip, as shown in FIG. 1, a metal layer is formed on each of electrode pads on an active surface of the semiconductor chip for preventing destruction of the semiconductor chip in a carrier by laser ablation. The carrier structure embedded with a semiconductor chip includes: a carrier board 11, on which a cavity is formed; a semiconductor chip 12 which is placed in the cavity, and has plural electrode pads 13 formed on an active surface thereof a protective layer 14 formed on the carrier board 11 embedded with the semiconductor chip 12, and accordingly revealing the plural electrode pads 13; plural metal plates 15 formed on surfaces of the electrode pads 13; and a built-up structure 16 formed on surfaces of the semiconductor chip 12 and the carrier board 11. The built-up structure 16 is formed on the surfaces of the semiconductor chip 12 and the carrier board 11, and conducts the carrier board 11 to the electrode pads 13 of the semiconductor chip 12.

Because the built-up structure is formed on only one side of the aforementioned packaging structure, both the conductive path and width of the packaging structure are smaller than that in conventional BGA packaging substrates. However, uneven stress occurs between the surfaces with or without the built-up structure so that the carrier board suffers warpage due to the asymmetrical built-up structure thereon. The above-illustrated results in production being difficult, yield decrease resulting from the packaging structure being excessively warped, reliability decrease, and so forth. Hence, carrier boards made of a single material are not satisfactory to overcome the shortcomings mentioned above.

SUMMARY OF THE INVENTION

In view of the above conventional shortcomings, an object of the present invention is to provide a packaging structure with circuits directly connected to a semiconductor chip. In the packaging structure, a metal layer with or without metal oxide layers serves as a carrier board so as to enhance the strength for resisting warpage.

In order to achieve the object described above, the present invention provides a packaging structure with circuits directly connected to a semiconductor chip, comprising: a carrier board having a through cavity; a semiconductor chip disposed in the through cavity of the carrier board, which has an active surface, wherein a plurality of electrode pads are disposed on the active surface; at least one built-up structure disposed on the surface of the carrier board on the same side as the active surface of the semiconductor chip, which comprises a dielectric layer of which part surface is revealed by the through cavity of the carrier board, wherein a plurality of circuit layers and conductive structures are located on and in the dielectric layer, and the electrode pads of the semiconductor chip are conducted by parts of the conductive structures to the circuit layers; and an adhesive material formed on the part surface of the dielectric layer revealed by the through cavity and on a lateral surface of the semiconductor chip, but without contacting to the carrier board.

In the packaging structure of the present invention, the carrier board can be a metal plate. Preferably, a metal oxide layer is formed on each of two sides of the metal plate. Besides, the metal plate in the carrier board of the present invention can be preferably made of aluminum (Al) so that the metal oxide layer can be made of aluminum oxide. Therefore, this carrier board can serve as a frame of the packaging structure in the present invention after the through cavity is formed in the carrier board. Moreover, the electrode pads on the semiconductor chip in the carrier board can be preferably made of Cu or Al.

In the packaging structure of the present invention, the dielectric layer and the adhesive material can be made of the same or different materials, which are at least one selected from the group consisting of Ajinomoto build-up film (ABF), bismaleimide triazine (BT), benzocyclobutene (BCB), liquid crystal polymer, polyimide (PT), poly(phenylene ether), poly (tetrafluoroethylene), aramide, epoxy resin, and glass fiber. If the dielectric layer and the adhesive material are made of different materials, the dielectric layer is preferably made of ABF, and the adhesive material is preferably made of epoxy resin. If the dielectric layer and the adhesive material are made of the same, it is preferable to be ABF. Illustrated in detail, the through cavity can be filled with the adhesive material so that the semiconductor chip is fastened when the dielectric layer of the built-up structure is disposed on the surface of the carrier board.

Besides, the circuit layers and the conductive structures in the dielectric layer can be respectively made of Cu, Sn, Ni, Cr, Pd, Ti, Sn/Pb, or an alloy thereof Preferably, those can be made of Cu.

In the packaging structure of the present invention, a protective layer can be formed on the surface or part of the surface of the dielectric layer revealed by the through cavity, and it covers the lateral surface of the adhesive layer. The protective layer is preferably made of epoxy resin so as to fasten or protect the semiconductor chip intensively.

In the packaging structure of the present invention, a solder mask is 5 formed on the surface or part of the surface of the dielectric layer revealed by the through cavity so as to protect the dielectric layer as well as to prevent environmental moisture from penetrating the substrate. Therefore, unstable problems of the packaging structure, such as warpage, can be avoided. The solder mask can be photosensitive resin material.

In the packaging structure of the present invention, the outer circuit layer on the surface of the dielectric layer on the side unattached with the semiconductor chip of the built-up structure can have a plurality of conductive pads.

The packaging structure of the present invention can further comprise a patterned solder mask formed on the outer surface of the built-up structure. The patterned solder mask has a plurality of openings to reveal part of the circuit layer serving as conductive pads. Furthermore, solder bumps are mounted on the surfaces of the revealed conductive pads.

Hence, warpage of a coreless packaging structure, due to uneven stress resulting from asymmetrical built-up structures, can be avoided. Because of greater rigidity of the carrier board in the packaging structure, uneven stress resulting from asymmetrical built-up structures can be resisted thereby so as to reduce possibility of warpage. At least one surface of the carrier board is oxidized by means such as anodic oxidation to form a metal oxide (ceramic) material thereon. Moreover, interfaces of the carrier board made of a metal and of the metal oxide material connect closely to each other. Therefore, the packaging structure with circuits directly connected to a semiconductor chip in the present invention has both characteristics of metal tenacity and ceramic rigidity.

Other objects, advantages, and novel features of the invention will become more apparent from the following detailed description when taken in conjunction with the accompanying drawings.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE PREFERRED EMBODIMENT

Figure 1:
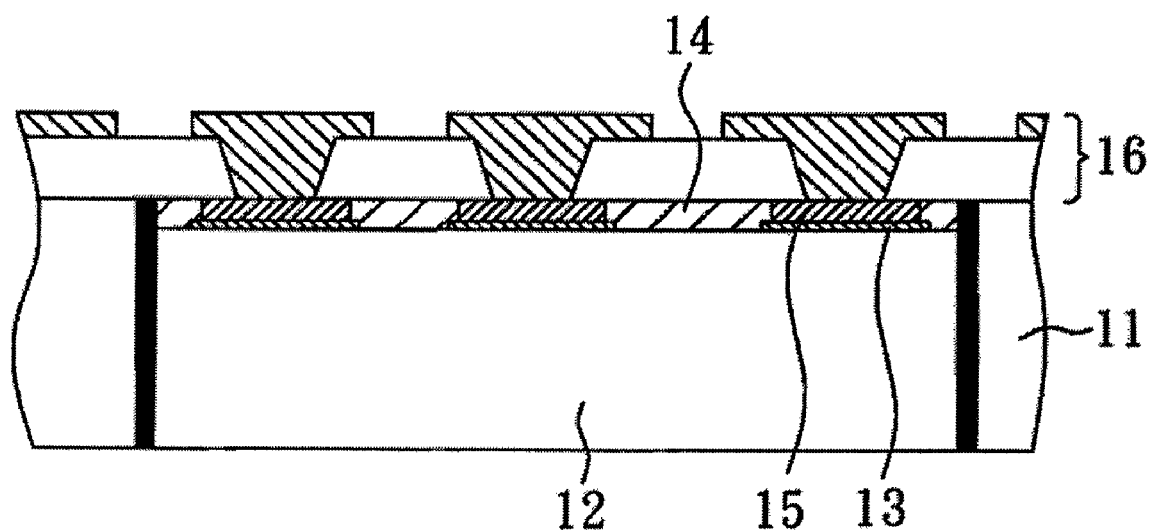
FIG. 1 is a cross-sectional view of a conventional carrier structure embedded with semiconductor chips.

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only reveal elements relative to the present invention. The elements revealed in the drawings are not necessarily aspects of the practice, and quantity and shape thereof are optionally designed. Further, the design aspect of the elements can be more complex.

Figure 2:
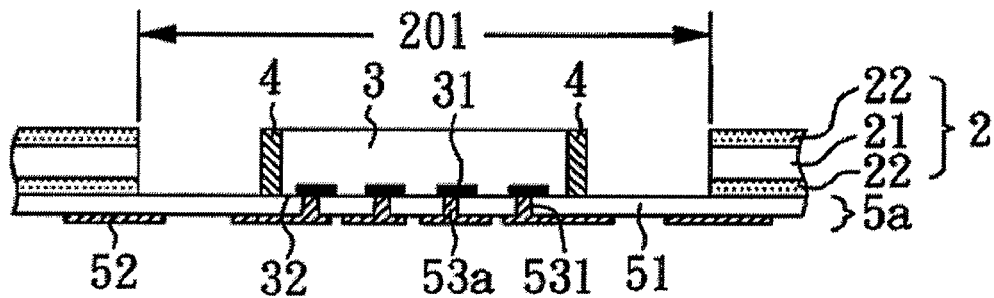
FIGS. 2 and 3 are cross-sectional views of packaging structures with circuits directly connected to a semiconductor chip in a preferred embodiment of the present invention.
Figure 3:
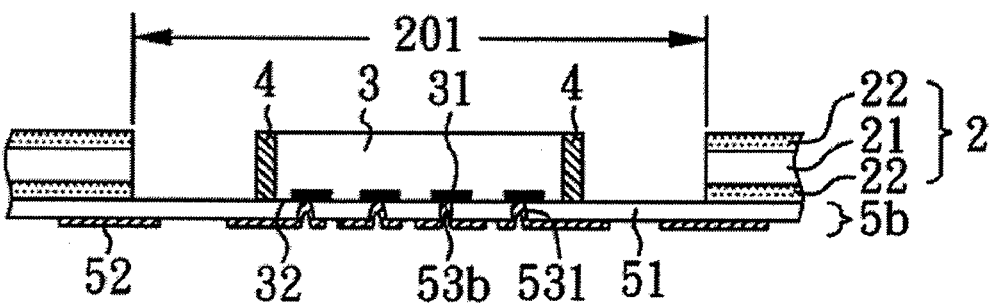

With reference to FIGS. 2 to 3, there are shown cross-sectional views of packaging structures in the present invention. The packaging structure, as shown in FIG. 2, comprises a carrier board 2, a semiconductor chip 3, and a built-up structure 5a (FIG. 2), 5b (FIG. 3). The carrier board 2 has a through cavity 201 therein. Herein, the carrier board 2 comprises a metal plate 21 of which two sides respectively have a metal oxide layer 22. In the present embodiment, the metal plate 21 can be made of Al. Besides, the carrier board 2 can serve as a frame of the packaging structure in the present invention after the through cavity 201 is formed in the carrier board 2. The semiconductor chip 3 is disposed in the through cavity 201 of the carrier board 2. An adhesive material 4 covers lateral sides of the semiconductor chip 3, but it does not connect to the carrier board 2. The semiconductor chip 3 has an active surface 32 on which a plurality of electrode pads 31 are disposed. In the present invention, the adhesive material 4 covering on the lateral sides of the semiconductor chip 3 can be made of epoxy resin, and the electrode pads 31 on the active surface 32 of the semiconductor chip 3 can be made of Cu. Herein, a diameter of the through cavity 201 is small but it is greater than a width of the semiconductor chip 3 before the through cavity 201 is formed in a greater diameter. Illustrated in detail, the small through cavity 201 is filled with the adhesive material 4. Subsequently, the through cavity 201 is modified to possess a greater diameter after the built-up structure 5a is disposed on a surface of the carrier board 2 and on the active surface 32 of the semiconductor chip 3. Therefore, the adhesive material 4 does not contact to the carrier board 2. The built-up structure 5a comprises a dielectric layer 51 which is made of at least one selected from the group consisting of Ajinomoto build-up film (ABF), bismaleimide triazine (BT), benzocyclobutene (BCB), liquid crystal polymer, polyimide (PT), poly(phenylene ether), poly(tetrafluoroethylene), aramide, epoxy resin, and glass fiber. In the present embodiment, the dielectric layer 51 is made of ABF. Besides, the dielectric layer 51 is disposed on the surface of the carrier board 2 on the same side as the active surface 32 of the semiconductor chip 3. Part surface of the dielectric layer 51 is revealed by the through cavity 201. The adhesive material 4 is in contact with the part surface of the dielectric layer 51 so as to fasten the semiconductor chip 3. A plurality of circuit layers 52 are disposed on the surface of the dielectric layer 51 and conductive structures 53a (FIG. 2), 53b (FIG. 3) are formed respectively in a full fill and in a partial fill in vias 531 of the dielectric layer 51. The conductive structures 53a in a full fill or conductive structures 53b in a partial fill conduct the electrode pads 31 and the circuit layers 52 to outer electronic devices.

Figure 4:
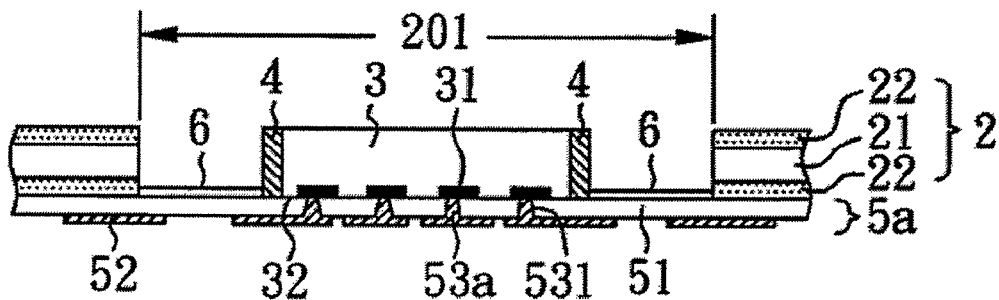
FIG. 4 is a cross-sectional view of a packaging structure with circuits directly connected to a semiconductor chip in another preferred embodiment of the present invention.
Figure 5:
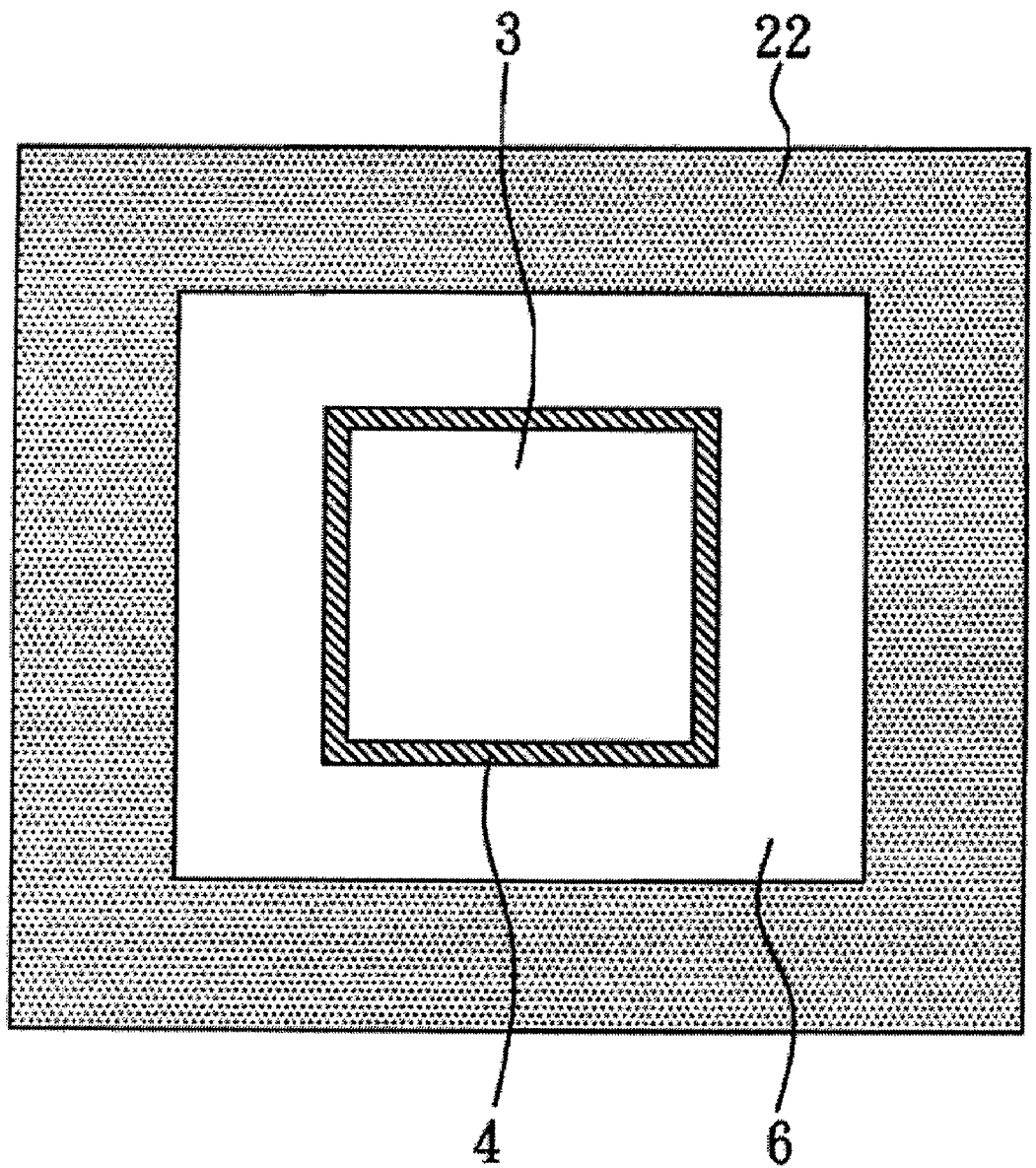
FIG. 5 is a top view of the packaging structure with circuits directly connected to a semiconductor chip shown in FIG. 4.
Figure 6A:
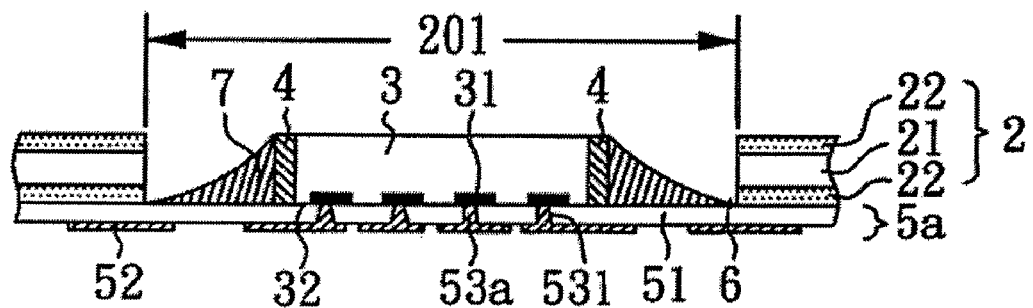
FIGS. 6a and 6b respectively are cross-sectional views of packaging structures with circuits directly connected to a semiconductor chip in the present invention.

With reference to FIGS. 4 and 5, FIG. 4 shows a cross-sectional view of a packaging structure in the present invention, and FIG. 5 shows a top view of the packaging structure in the present invention. In FIG. 4, the packaging structure can be used as shown in FIG. 2 or 3. Using FIG. 2 as an example, a solder mask 6 is coated on the surface revealed by the through cavity 201 of the dielectric layer 51 in the packaging structure, and it can be made of a photosensitive resin material. The solder mask 6 is used for protection of the dielectric layer 51 from outer environmental contamination. Therefore, the packaging structure of the present invention with the solder mask 6 coated in the through cavity 201 as shown in FIGS. 4 and 5 is achieved.

Figure 7A:
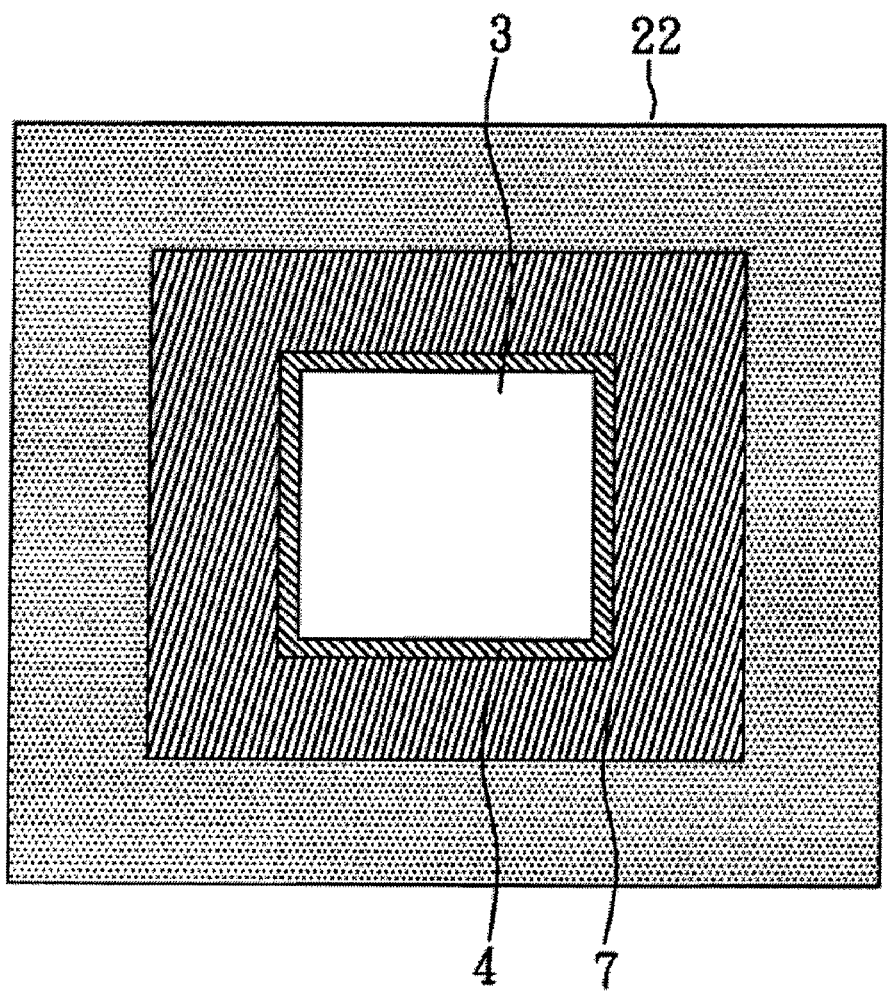
FIGS. 7a and 7b are top views of the packaging structure with circuits directly connected to a semiconductor chip shown in FIGS. 6a and 6b, respectively.
Figure 6B:
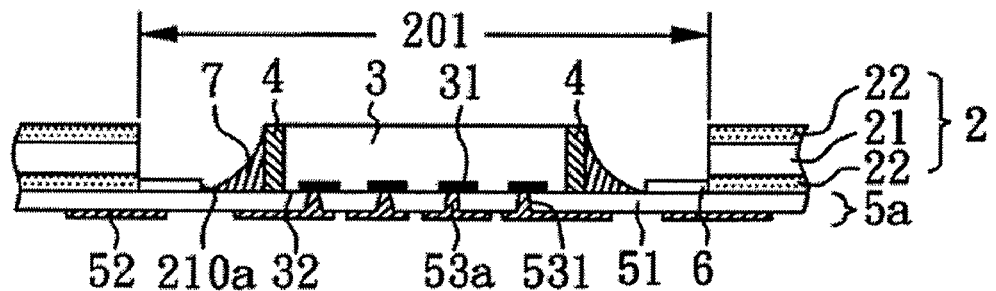
Figure 7B:
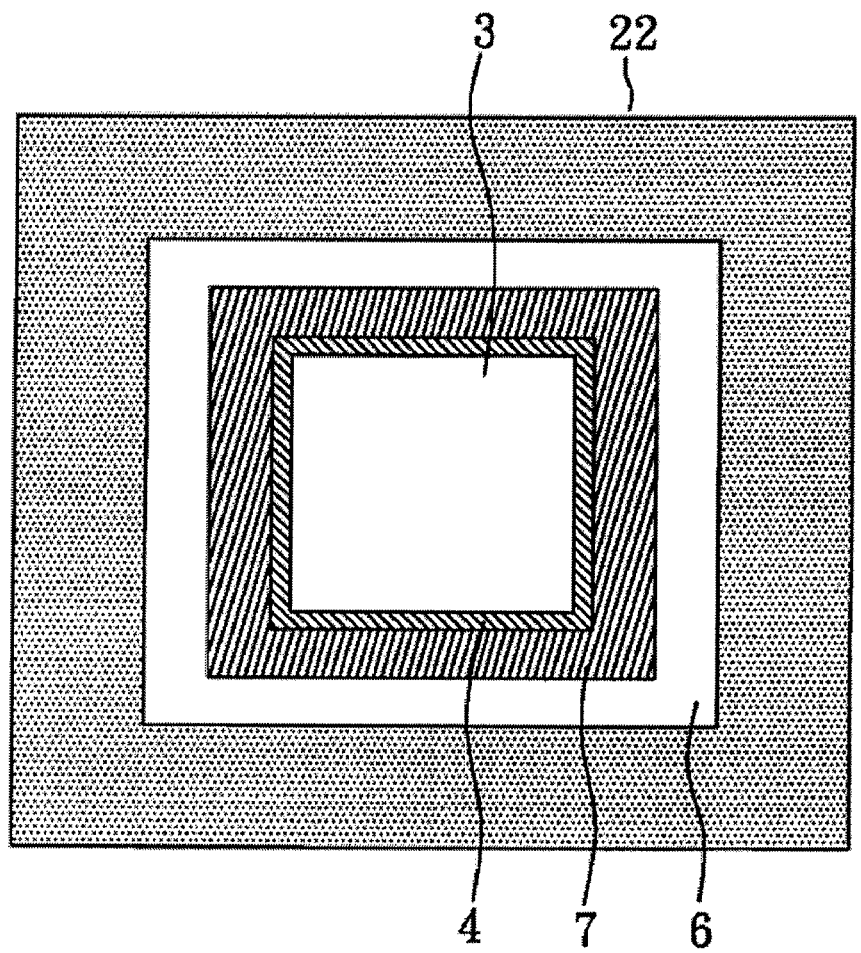

With reference to FIGS. 6a, 6b, 7a, and 7b, FIGS. 6a and 6b show 5 cross-sectional views of packaging structures in the present invention, and FIGS. 7a and 7b show top views of the packaging structures in the present invention. Using the packaging structure of FIG. 2 as an example, a protective material 7 is formed on the surface of the dielectric layer 51 revealed by the through cavity 201 as show in FIG. 6a. The protective material 7 contacts the carrier board 2, and it can be made of epoxy resin. Besides protecting the dielectric layer 51, the protective material 7 can cooperate with the adhesive material 4 to fasten and protect the semiconductor chip 3 intensively. Therefore, there is a top view of the packaging structure comprising the protective material 7 in the through cavity 201 thereof as shown in FIG. 7a. Otherwise, exemplifying the packaging structure of FIG. 4, the solder mask 6 in the through cavity 201 is patterned to form an opening 210a by exposure and development as shown in FIG. 6b. Then, a protective material 7, which can be made of epoxy resin, is formed in the opening 210a, and it does not contact the carrier board 2. Hence, the protective material 7 can cooperate with the adhesive material 4 to fasten and protect the semiconductor chip 3 intensively. There is a top view of the packaging structure comprising the protective material 7 and the solder mask 6 in the through cavity 201 thereof as shown in FIG. 7b.

As illustrated above, a built-up structure 8a can be formed by built-up technology on the surface of the dielectric layer 51. The built-up structure 8a can be increased in layer counts if necessary. The built-up structure 8a comprises a dielectric layer 81 in which circuit layers 82 are formed, and conductive structures 83a formed by filling a conductive material in vias 831 of the dielectric layer 81. The outer circuit layer 82 in the dielectric layer 81 on the side without the semiconductor chip being disposed of the built-up structure 8a is formed with conductive pads 84. A patterned solder mask layer 85, which reveals the conductive pads 84 on the surface of the built-up structure 8a, is coated on the surface of the built-up structure 8a. The solder mask 85 can be made of a photosensitive resin material. Finally, solder bumps 86 are formed on the conductive pads 85 by electroplating or printing. The solder bumps 86 can be made of one selected from the group consisting of Cu, Sn, Pb, Ag, Ni, Au, Pt, and an alloy thereof.

Figure 8:
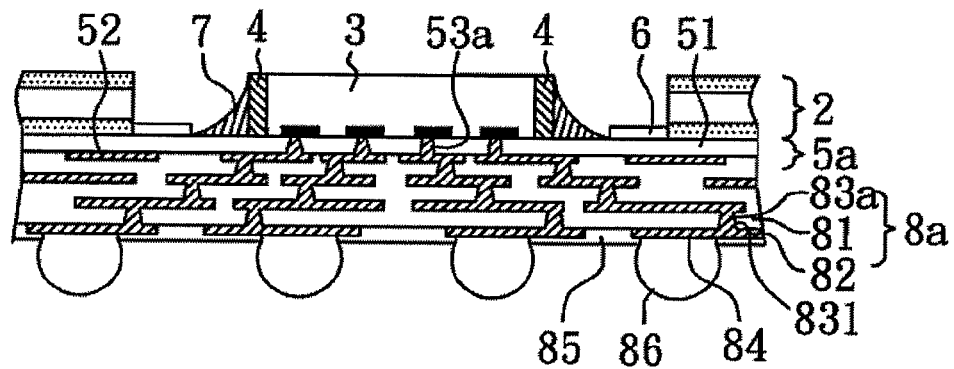
FIGS. 8 and 9 respectively are cross-sectional views of packaging structures, with circuits directly connected to a semiconductor chip, conducted with solder bumps in another preferred embodiment of the present invention.
Figure 9:
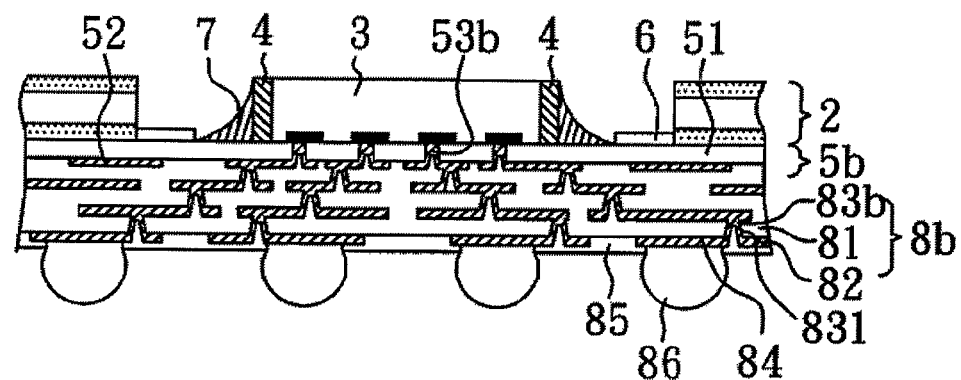

A packaging structure shown in FIG. 9 is different from that shown in FIG. 8 only in conductive structures 83b, which are not fully filled with a conductive material, formed in the vias 831 of the dielectric layer 81. Therefore, a built-up structure 8b different from that in FIG. 8 can be manufactured so as to obtain the packaging structure in FIG. 9.

Figure 10:
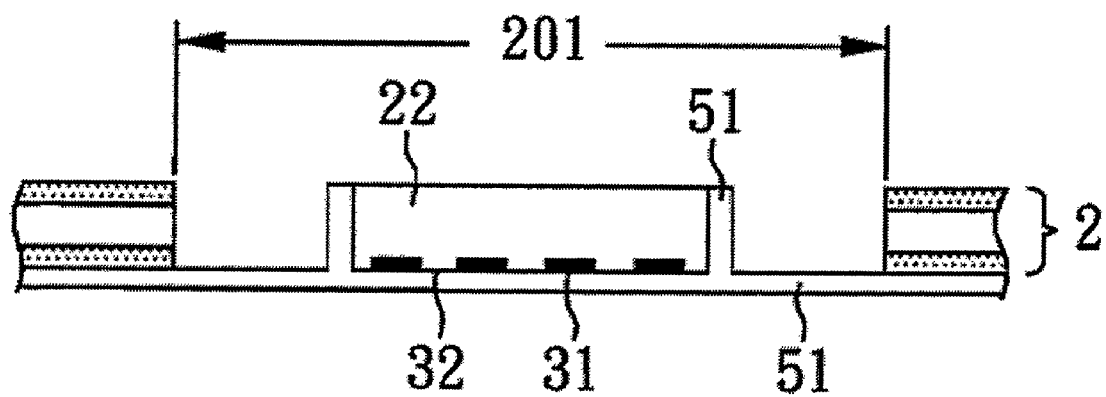
FIG. 10 is a cross-sectional view of a semiconductor chip fastened in a carrier board in another preferred embodiment of the present invention.

With reference to FIG. 10, a packaging structure with circuits directly connected to a semiconductor chip in the present embodiment is similar to those shown in FIG. 2 and 3, except for a method for fastening the semiconductor chip 3 in the carrier board 2.

The packaging structure having the semiconductor chip 3 fastened in the carrier board 2 is shown in FIG. 10. Before the semiconductor chip 3 is fastened in the carrier board 2, a side of the carrier board 2 possessing the through cavity 201 is covered with a release film (not shown in FIG. 10). Subsequently, the semiconductor chip 3 is disposed in the through cavity 201 through being fastened by the release film temporarily. The dielectric layer 51 is laminated on the surface of the carrier board 2 on the same side as the active surface 32 of the semiconductor chip 3 so as to fill into the through cavity 201 and to wholly cover the lateral surface of the semiconductor chip 3 before circuits are formed. The diameter of the through cavity 201 is small before the lateral surface is covered by the dielectric layer 51. The through cavity 201 of the carrier board is enlarged in a greater diameter after the dielectric layer 51 is filled into the through cavity 201 totally. Therefore, the through cavity 201 of the present invention is afforded. In the present embodiment, the dielectric layer 51 is used as an adhesive material. Other structures are the same as shown in FIGS. 2 and 3. Finally, the packaging structure with circuits directly connected to a semiconductor chip is afforded in the present invention.

Although the present invention has been explained in relation to its preferred embodiment, it is to be understood that many other possible modifications and variations can be made without departing from the scope of the invention as hereinafter claimed.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

What is claimed is:

1. A packaging structure with circuits directly connected to a semiconductor chip, comprising:
   a carrier board having a through cavity;
   a semiconductor chip disposed in the through cavity of the carrier board, which has an active surface, wherein a plurality of electrode pads are disposed on the active surface;
   at least one built-up structure disposed on the surface of the carrier board on the same side as the active surface of the semiconductor chip, which comprises a dielectric layer of which part surface is revealed by the through cavity of the carrier board, wherein a plurality of circuit layers and conductive structures are located on and in the dielectric layer, and the electrode pads of the semiconductor chip are conducted by parts of the conductive structures to the circuit layers; and
   an adhesive material formed on the part surface of the dielectric layer revealed by the through cavity and on a lateral surface of the semiconductor chip, but without contacting to the carrier board.

2. The packaging structure as claimed in claim 1, wherein the carrier board is a metal plate.

3. The packaging structure as claimed in claim 2, wherein two surfaces of the metal plate respectively has a metal oxide layer formed thereon.

4. The packaging structure as claimed in claim 2, wherein the metal plate is made of aluminum (Al).

5. The packaging structure as claimed in claim 1, wherein the electrode pads are made of Cu or Al.

6. The packaging structure as claimed in claim 1, wherein the dielectric layer is made of at least one selected from the group consisting of Ajinomoto build-up film (ABF), bismaleimide triazine (BT), benzocyclobutene (BCB), liquid crystal polymer, polyimide (PT), poly(phenylene ether), poly(tetrafluoroethylene), aramide, epoxy resin, and glass fiber.

7. The packaging structure as claimed in claim 1, wherein the circuit layers and the conductive structures are made of Cu, Sn, Ni, Cr, Pd, Ti, SnJ'Pb, or an alloy thereof.

8. The packaging structure as claimed in claim 1, wherein the adhesive material is epoxy resin.

9. The packaging structure as claimed in claim 1, wherein the adhesive material is made of the material same as the dielectric layer of the built-up structure.

10. The packaging structure as claimed in claim 1, wherein a solder mask is formed on the part surface of the dielectric layer revealed by the through cavity.

11. The packaging structure as claimed in claim 1, wherein the part surface of the dielectric layer revealed by the through cavity and the lateral surface of the adhesive layer are covered by a protective layer.

12. The packaging structure as claimed in claim 11, wherein the protective layer does not connect with the carrier board, and a solder mask is formed on the surface of the dielectric layer uncovered by the protective layer.

13. The packaging structure as claimed in claim 11, wherein the protective layer is made of epoxy resin so as to fasten or protect the semiconductor chip intensively.

14. The packaging structure as claimed in claim 12, wherein the protective layer is made of epoxy resin so as to fasten or protect the semiconductor chip intensively.

15. The packaging structure as claimed in claim 10, wherein the solder mask is made of a photosensitive resin.

16. The packaging structure as claimed in claim 12, wherein the solder mask is made of a photosensitive resin.

17. The packaging structure as claimed in claim 1, wherein the outer circuit layer on the surface of the dielectric layer on the side unattached with the semiconductor chip of the built-up structure comprises a plurality of conductive pads.

18. The packaging structure as claimed in claim 17, further comprising a plurality of solder bumps mounted on the surfaces of the conductive pads.

* * * * *